(12) United States Patent
Luttgens et al.

(10) Patent No.: US 8,125,138 B2
(45) Date of Patent: Feb. 28, 2012

(54) STRUCTURED OLED WITH MICRO OPTICS FOR GENERATING DIRECTED LIGHT

(75) Inventors: Gunnar Luttgens, Aachen (DE); Benno Spinger, Aachen (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 302 days.

(21) Appl. No.: 12/302,426

(22) PCT Filed: Jun. 4, 2007

(86) PCT No.: PCT/IB2007/052085
§ 371 (c)(1),
(2), (4) Date: Nov. 25, 2008

(87) PCT Pub. No.: WO2008/001241
PCT Pub. Date: Jan. 3, 2008

(65) Prior Publication Data
US 2009/0153038 A1     Jun. 18, 2009

(30) Foreign Application Priority Data

Jun. 14, 2006     (EP) .................................. 06115469

(51) Int. Cl.
*H01L 51/50* (2006.01)
*H01L 51/52* (2006.01)

(52) U.S. Cl. ........ 313/501; 313/503; 313/506; 313/509; 313/110

(58) Field of Classification Search .......... 313/500–512, 313/110–113
See application file for complete search history.

(56) References Cited

U.S. PATENT DOCUMENTS

| | | | |
|---|---|---|---|
| 6,570,324 B1 | 5/2003 | Tutt et al. | |
| 6,680,578 B2 | 1/2004 | Antoniadis et al. | |
| 2003/0020399 A1 | 1/2003 | Moller et al. | |
| 2004/0042198 A1 | 3/2004 | Cok | |
| 2005/0269950 A1* | 12/2005 | Giraldo et al. | 313/509 |
| 2006/0114365 A1 | 6/2006 | Takahashi | |

FOREIGN PATENT DOCUMENTS

| | | | |
|---|---|---|---|
| EP | 1110816 A2 | 6/2001 | |
| EP | 1051582 B1 | 8/2003 | |
| JP | 09171892 | 6/1997 | |
| JP | 2000275732 A | * | 10/2000 |
| WO | 9940364 | 8/1999 | |
| WO | 0133598 A1 | 5/2001 | |
| WO | 03077325 A1 | 9/2003 | |
| WO | 2004010406 A2 | 1/2004 | |

\* cited by examiner

*Primary Examiner* — Mariceli Santiago
(74) *Attorney, Agent, or Firm* — John F. Salazar; Mark L. Beloborodov

(57) ABSTRACT

In a lighting device with at least one continuous OLED layer (4) with a first electrode layer (5), a second electrode layer (6) and a plurality of optical collimating means, the second electrode layer (6) is only in electrical contact with the OLED layer (4) within spaced sections (6a), arranged within acceptance angles of the collimating means. Such a lighting device can be manufactured efficiently and is highly energy-efficient.

Figure 1:
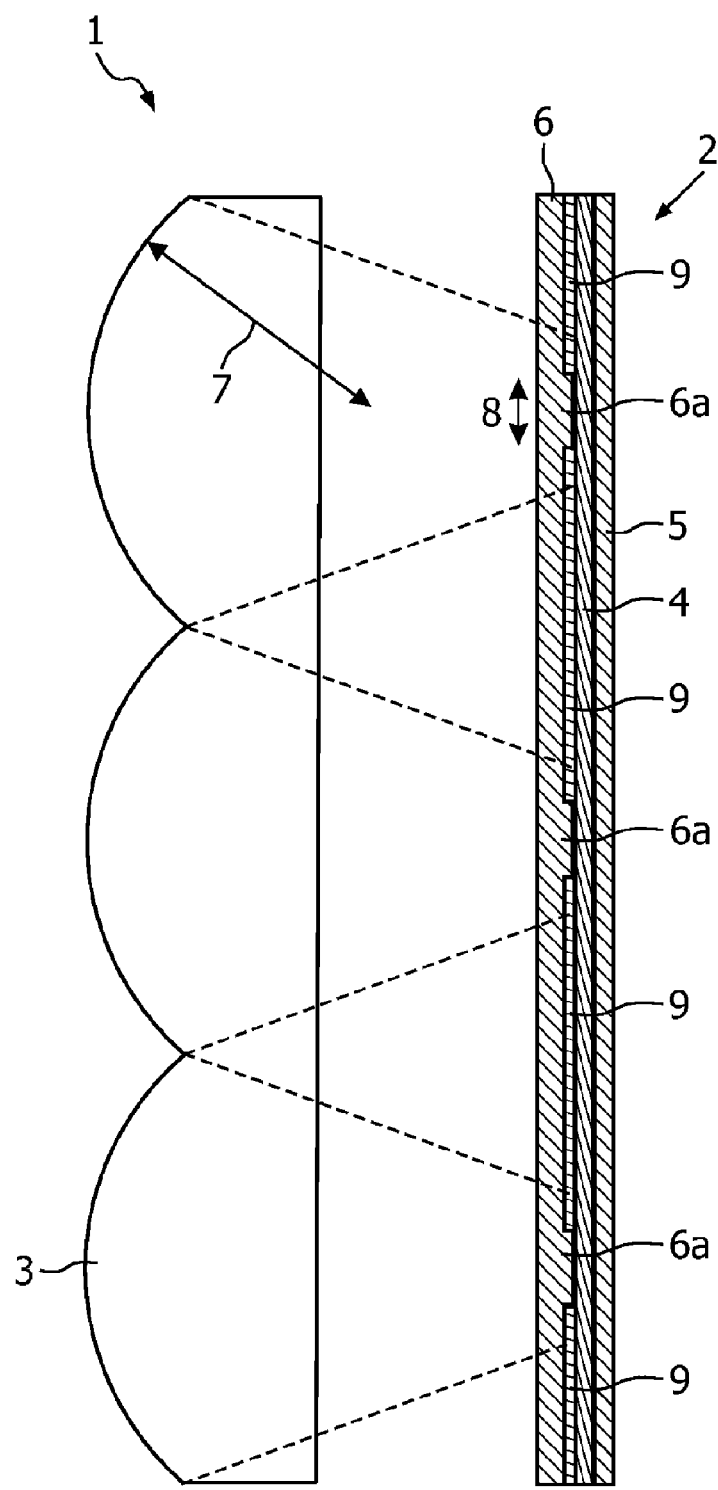

5 Claims, 3 Drawing Sheets

STRUCTURED OLED WITH MICRO OPTICS FOR GENERATING DIRECTED LIGHT

This application is a national stage application under 35 U.S.C. §371 of International Application No. PCT/IB2007/052085 filed on Jun. 4, 2007, and published in the English language on Jan. 3, 2008 as International Publication No. WO/2008/001241, which claims priority to European Application No. 06115469.6, filed on Jun. 14, 2006, incorporated herein by reference.

The invention relates to a lighting device with an organic light-emitting device (OLED).

Organic light emitting devices are today readily available for integration into lighting or display products. The OLED technology is especially advantageous, since it enables the manufacture of lighting devices, which irradiate from a relatively large surface area, while can be made extremely thin.

An OLED exhibits a lambertian radiation pattern, resulting in a large beam divergence. For display applications, for example when using an OLED layer as a light source for a display panel, the lambertian radiation pattern is advantageous. On the other hand, for lighting or signalling applications, as for example in automobile applications, a directed beam is usually required. Because of the law of etendue conservation, it is problematic to collimate light of large-area light emitters, such as OLEDs.

The document EP 1 051 582 discloses a lighting device, showing a large-area light emitter. To collimate the generated light, a plurality of transparent light-directing members are provided. On said light-directing members, a plurality of semiconductor lighting devices, such as OLEDs, are arranged. Each semiconductor lighting device emits light into the respective light-directing member, which is then collimated, so that a predefined beam shape can be generated. Although this solution enables the construction of a lighting device, emitting directed light from a large-area light emitter, the manufacture of such device with a plurality of OLEDs is very complex and expensive.

It is therefore an object of the current invention to provide an OLED lighting device, which enables a directed beam to be generated and which can be manufactured efficiently and inexpensively. The object is solved according to the invention by a lighting device according to claim 1. Dependent claims relate to preferred embodiments of the invention.

According to the invention, at least one continuous OLED layer is sandwiched between a first and second electrode layer, which electrode layers electrically contact to respective first and second surfaces of the OLED layer. To generate a directed beam of light, optical collimating means are provided, spaced from the OLED layer by at least the second electrode layer. Each of the collimating means define an acceptance angle, in which light is accepted by the collimating means to form an directed output beam of light. In the present invention, the acceptance angle of each of the collimating means forms an acceptance area on the OLED layer, from where light, generated in the OLED layer is accepted by the collimating means. In the context of the present invention, the term acceptance angles refers to the plurality of angular ranges, defined by the plurality of collimating means.

The second electrode layer is advantageously only in electrical contact with the OLED layer in spaced sections, which are each within the acceptance angle of the respective collimating means. Thus, the emission of light within the OLED layer is only stimulated within the acceptance angles. While the invention advantageously allows the use of a continuous OLED layer, light is not generated in areas of the OLED layer, where light could not be accepted by the collimating means and thus would not contribute to form the directed output beam. In the context of the present invention one or more sections can be formed in the acceptance angle of each of the collimating means.

The term "OLED layer" is in the context of the present invention understood to include the necessary emitter (EL), electron transport (ETL) and hole transport layers (HTL), as well as any other eventually necessary layer, depending on the OLED technology used.

Within OLED structures, light is generated by the recombination of electron/hole pairs in the EL layer, which are introduced in the OLED layer. Usually suitable electrodes are arranged laminar on the surfaces of the OLED to introduce the electron/hole pairs. The energy, released by the recombination of an electron/hole pair generates an exciton, which stimulates a molecule within the EL layer to emit a photon at the desired wavelength and thus generates the desired coloured light.

The OLED layer may be formed of any commercially available OLED material, including SM-OLEDs (small-molecule OLED's) and PLEDs (polymer-light-emitting-diodes).

The OLED layer is electrically contacted by said first and said second electrode layers. In terms of the present invention, said second surface of the OLED layer shall be defined as the light emitting surface. To enable a sufficient efficacy of the lighting device, the second electrode layer therefore is at least partially transparent in the desired wavelength-range. For example, the second electrode layer may be formed from indium-tin-oxide (ITO), which is transparent in the visible wavelength range. The first electrode layer does not need to be transparent and may be formed for example from a metal or a metal alloy. Preferably, the surface of the first electrode layer, which contacts to said first surface of the OLED layer should be reflective in the desired wavelength-range to enable an even higher efficacy of the lighting device.

To enable the formation of a defined output beam, a plurality of optical collimating means are arranged on the side of the second surface of the OLED layer, i.e. the light-emitting surface, spaced from the OLED layer by at least said second electrode layer. The plurality of optical collimating means collimate the light, emitted by the OLED layer. The collimating means may be formed to collimate light only in one axis, perpendicular to the optical axis of the lighting system or preferably to collimate light in two axes, each perpendicular to the optical axis, according to the specific application. In terms of the present invention, the optical axis is defined perpendicular to and in the center of the second surface of the OLED layer.

The collimating means may be formed of any suitable material, preferably glass or polymer material, depending on the desired output beam shape and thus the necessary difference in refractive indices. Naturally, the material of the collimating means should be chosen, so as not to introduce relevant losses in the desired wavelength range. The optical collimating means may preferably be formed by a plurality of lenses or microlenses or a foil of lenses or microlenses, when a polymer material is used. The use of a polymer foil is especially preferred, since such a polymer foil can be formed advantageously in a cost-effective injection moulding process. The collimating means may be for example cylindrical lenses, spherical lenses or CPC collimators (compound parabolic compressor).

It may further be possible to include simple shaped elements, which collimate the incident light, for example by using a material, in which the refractive index is varied according to the desired output beam shape. For example, such elements may be cylindrical gradient index lenses. The collimating means may comprise further collimators, lenses, lens groups, lens arrays or any combination thereof, depending on the application.

The optical properties of the plurality of the collimating means may be identical to each other, in order to form a collimated output beam with an infinite focal point. If necessary, each of the plurality of collimating means may also exhibit individual optical properties, to obtain a specifically shaped output beam. Here, each collimating means forms a part of an overall "virtual lens", which determines the specific shape of the output beam. Such "virtual lenses", formed by a plurality of single collimating elements are commonly designed using a finite elements method.

In a simple example, the outermost collimating means in a beam may be formed to direct light towards the optical axis at a defined focal point, while the inner collimating means are formed to direct light along the optical axis of the lighting device, resulting in a narrow beam at the defined focal point.

The optical collimating means may be formed directly on the second electrode layer or preferably within a defined proximity along the optical axis of the lighting device. In the second case, the gap between the second electrode layer and the collimating means may be filled with a material with defined refractive index, for example index matching fluid, or simply be left filled with air. An arrangement of the collimating means in a defined proximity of the second electrode layer is especially advantageous in automobile applications, where the collimating means may be formed integrally with the top cover of the automobile lamp and thus reduces the overall cost of the automobile lamp.

Each of the plurality of optical collimating means accepts light, incident to the collimating means only within a defined acceptance angle, i.e. within a defined acceptance area on the surface of the OLED layer. According to the invention, the second electrode layer exhibits spaced sections, so that the second electrode layer is only in electrical contact with the OLED within the acceptance angle of each of the optical collimating means and not in electrical contact in between the acceptance angles.

Thus, light is only generated within the acceptance angle of each of the collimating means, since due to the formation of the second electrode layer, charge carriers are only introduced into the OLED layer within the acceptance angles. The lighting device according to the invention is therefore very energy efficient, since photons are only generated in areas, where an acceptance by the collimating means is ensured. Any photon, generated outside of the acceptance angles would not be accepted by the collimating means and therefore contribute to the loss of the lighting device directly. In a device according to the invention therefore light is only generated where needed, while no complex structuring of the OLED layer or a manufacture of multiple OLEDs is necessary.

Due to the lens transform of the collimating means, a change in the dimensions of the sections will cause a change of the numerical aperture in the output beam. Thus, the shape of the output beam can be controlled by changing the dimensions of the sections, while the optical properties of the collimating means are maintained constant. Naturally, the dimensions of each section of the second electrode layer can be chosen independently or the same, depending on the application.

For many applications, as for example automotive signalling applications, an asymmetrical beam shape is desired. It is therefore preferred, that the aspect ratio of the sections is asymmetrical.

When providing asymmetrically formed sections, it is redundant to specifically form the collimating means to the desired output beam shape, which is even more cost efficient. When forming the sections asymmetrical as explained above, standard rotation-symmetric lenses can be used. As mentioned before, due to the lens transform, the numerical aperture of the output beam shape will show the same symmetry than the aspect ratio of the sections. For example, if the sections exhibit an aspect ratio of 2:1, the resulting beam width in the two axes perpendicular to the optical axis will also be 2°:1°.

To further shape the output beam, the dimensions of each of the sections may be varied over the extend of the OLED layer. For example, the outermost sections regarding to the output beam may show smaller dimensions than the inner sections. In this case, the intensity is reduced in the outermost regions of the beam, which may be desired in automotive applications, exemplary.

According to a preferred embodiment of the invention, the second electrode layer is discontinuous in between the sections, so that in these spaces, no charge carriers are introduced in the OLED layer. Such a structured electrode layer may be formed by printing techniques or by deposition through a respective mask. The thus formed single electrodes of the second electrode layer may be contacted by electrical wires using a bonding or soldering process.

In a further preferred embodiment of the invention, the second electrode layer is continuous over at least a plurality of sections and electrically isolated by an isolating layer in between the sections. This preferred embodiment enables a very cost-efficient manufacture of the second electrode layer, since a structuring of the electrode is not necessary. The isolating layer may be formed by any techniques, as know in the art. For example, the isolating layer may be an isolating lacquer, known from standard printed circuit boards, which is printed, painted or sprayed either on the OLED layer or the second electrode layer. Further, any isolating layer, know from standard semiconductors may be used, as long as the introduction of charge carriers in areas in between the sections can be inhibited sufficiently. It is especially preferred that the second electrode layer is continuous over all sections, which allows an even more cost-efficient manufacture.

Figure 2:
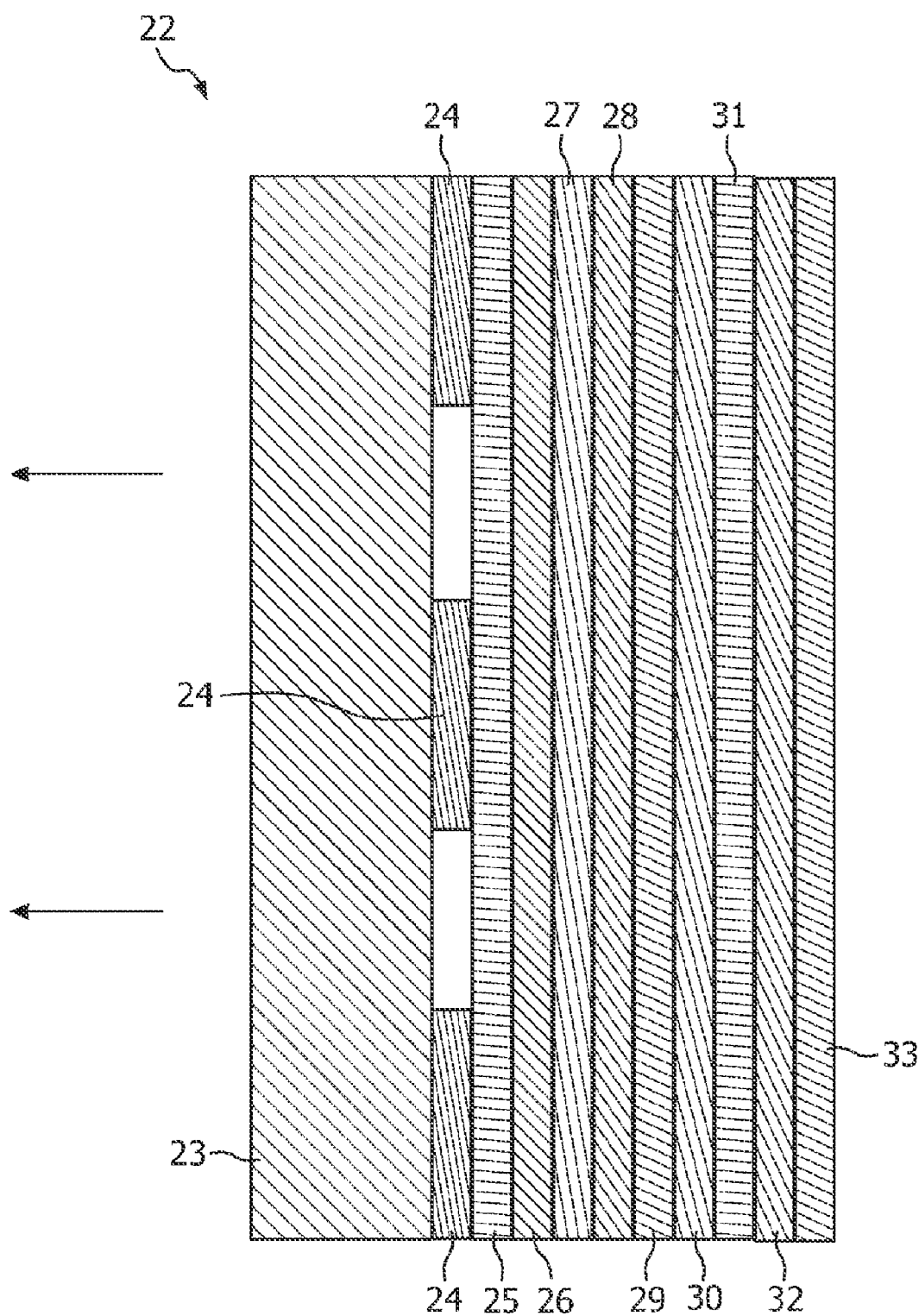
Figure 3:
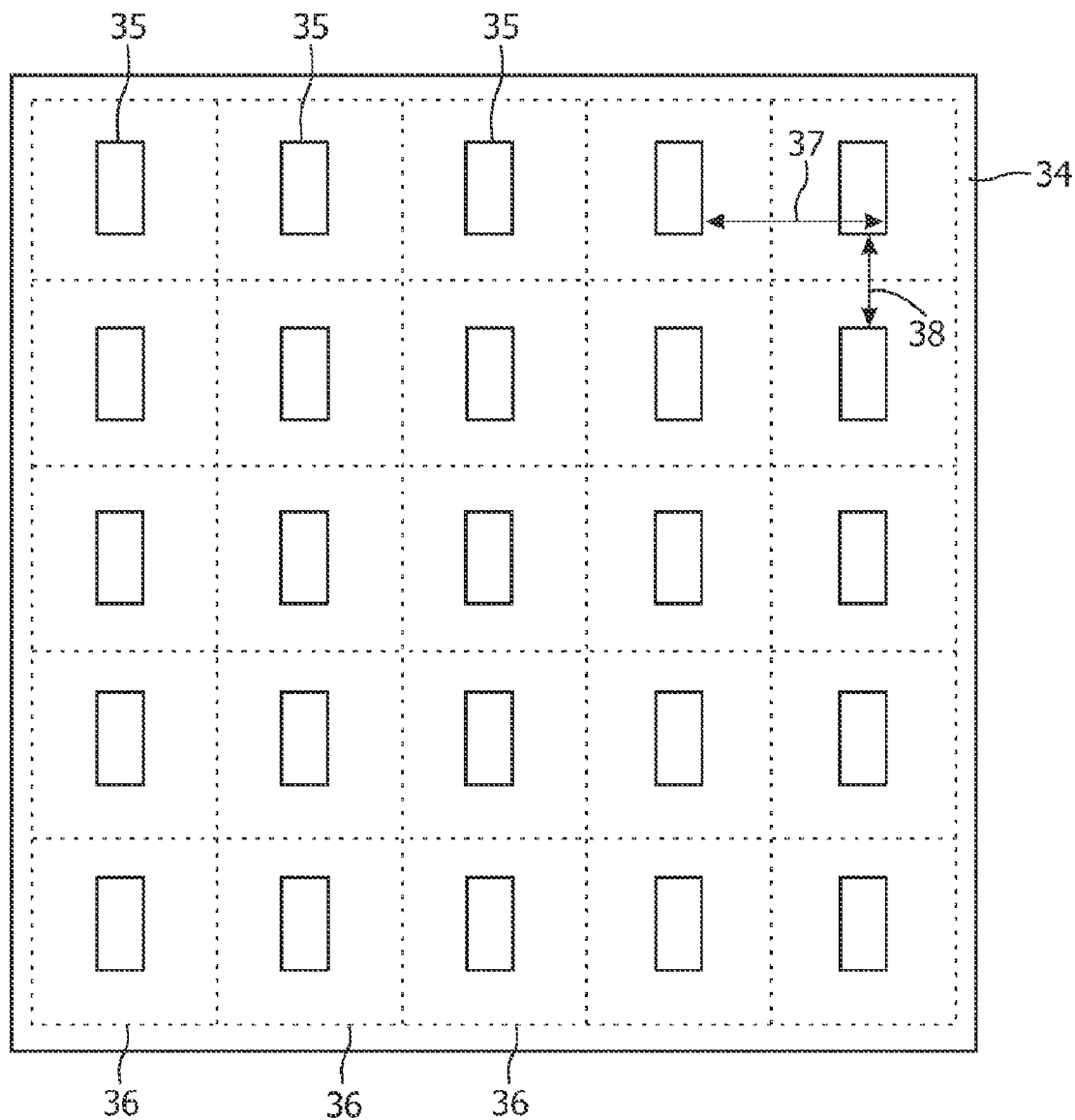

The invention is hereinafter explained in detail with reference to the accompanying drawings, in which FIG. 1 shows a cross section of first embodiment of the invention, FIG. 2 shows a second embodiment of the invention in a cross sectional view, and FIG. 3 shows a further embodiment of the invention.

Referring to FIG. 1, a lighting device 1 is formed from a stacked OLED 2 and a collimating lens array 3. The lens array 3 is formed from PMMA (Polymethylmethacrylate), which is transparent in the visible wave length range. Each single lens of the lens array 3 exhibits an acceptance angle, as depicted by the dotted lines in FIG. 1.

Spaced from the lens array 3, an OLED stack 2 is provided in a defined proximity. The OLED stack 2 comprises at least an OLED layer 4 and a first continues electrode layer 5, which is arranged on the back side of the OLED layer 4. A second electrode layer 6 is provided on the front side of the OLED layer 4.

The second electrode layer 6 is continuous, but is only in contact with the OLED layer 4 within sections 6a, which are within the acceptance angles of the lenses of the lens array 3. In between the sections, an isolating layer 9 is present. Due to this, the generation of light in the OLED layer 4 is only stimulated within the acceptance angles. While the first electrode layer 5 may be manufactured from a metal, such as aluminium, the second electrode layer 6 is an ITO electrode (indium-tin-oxide), which is transparent in the visible wave length range. Although not shown, further layers may be present in the OLED stack 2 not shown here because of clarity reasons.

In the present embodiment, each lens of the lens array exhibits a curvature radius 7 of 2.2 mm. The distance between the OLED stack 2 and the lens array 3 is 2.3 mm. The length of the sections 6a is 0.2 mm along the shown extension 8. Light is output from the lens array 3 at the side, opposite of the OLED stack 2.

A detailed view of a second exemplary OLED stack 22 is shown in a second embodiment of the invention according to FIG. 2. FIG. 2 shows a cross section through the OLED stack 22, where the direction of the emitted light is depicted by the shown arrows. A glass substrate 23 is provided to mechanically support the OLED stack 22. A transparent second electrode layer is formed as an ITO electrode 24 and is in this embodiment arranged discontinuously on the glass substrate 23, so that light is only generated in the OLED stack 22 within the acceptance angles of the respective lenses. The ITO electrode 24 is electrically connected to a suitable power supply. A further connection to the power supply is provided by the first electrode layer, which is formed by an aluminium electrode 33. The complete set up of the OLED stack 22 is described in detail in the following table:

| reference no. | material | thickness |
| --- | --- | --- |
| 23 | glass | 0.7 mm |
| 24 | ITO electrode | 80 nm |
| 25 | PEDOT | 30 nm |
| 26 | MTDATA | 20 nm |
| 27 | Spiro-TAD | 8 nm |
| 28 | CBP: FIrpic | 15 nm |
| 29 | CBP: Irppy | 10 nm |
| 30 | CBP: ADS076 | 60 nm |
| 31 | Alq 3 | 1 nm |
| 32 | LiF | 100 nm |
| 33 | aluminium (AL) electrode | 100 nm |

The set up explained above provides a white light organic LED.

FIG. 3 shows an exemplary set-up in a further embodiment of the invention in a plan view. The lighting device is designed to obtain an asymmetrically shaped output beam. As explained above, the OLED layer 34 is contacted by a discontinuous second electrode layer, which forms separated sections 35. The sections 35 are within the respective acceptance angle of each of the lenses 36 of the lens array, which are depicted by the shown dotted lines.

Each section 35 of the second electrode layer is formed asymmetrically with an aspect ratio of 2:1. Thus, the resulting beam angle of the output beam is also 2:1. In the present embodiment, each section 35 of the second electrode layer exhibits a length of 1 mm and a width of 0.5 mm. The length 37 between two corresponding edges of each section is 2 mm and the length 38 is 1 mm. This specific set up leads to a beam, which has a beam width of 20°/10° respectively, which is especially advantageous in automotive signalling applications. The set up shown in FIG. 3 further exhibits a fill factor of ⅛, which is very energy efficient. When forming the sections 35 asymmetrical as explained above, standard rotation-symmetric lenses can advantageously be used.

The invention claimed is:

1. A lighting device comprising:
   an OLED layer;
   a first electrode layer on a first surface of the OLED layer;
   an isolating layer on a second surface of the OLED layer opposed to the first surface of the OLED;
   a second electrode layer on the isolating layer, the second electrode layer comprising spaced sections extending through the isolating layer and electrically connecting to the second surface of the OLED layer; and
   lenses spaced from the second surface of the OLED layer by at least the second electrode layer, each lens defining a corresponding acceptance angle, wherein each spaced section is arranged within a corresponding acceptance angle defined by one of the lenses.

2. An OLED based illumination device, comprising:
   an OLED layer;
   a first electrode layer in electrical contact with and positioned on a first of said OLED layer;
   a discontinuous isolating layer on a second surface of said OLED layer having discontinuous sections;
   a second electrode layer adjacent said isolating layer, said second electrode layer having spaced sections extending through said isolating layer and in electrical contact with said second surface of said OLED layer at said discontinuous sections;
   a lens array spaced from said second surface of said OLED layer, each lens in said lens array defining a corresponding acceptance angle;
   wherein each spaced section of said second electrode layer is positioned within a corresponding of said lens within said array.

3. The OLED illumination device of claim 2 wherein each of said lenses in said lens array has a curvature radius of about 2.2 mm.

4. The OLED illumination device of claim 2 wherein said second electrode layer is about 2.3 mm away from said lens array.

5. The OLED illumination device of claim 2 wherein said spaced sections of said second electrode layer are each about 0.2 mm in length.

* * * * *